Sept. 2, 1969 F. B. HUGLE 3,465,213

SELF-COMPENSATING STRUCTURE FOR LIMITING BASE DRIVE CURRENT IN TRANSISTORS

Filed June 20, 1966 2 Sheets-Sheet 1

United States Patent Office 3,465,213

Patented Sept. 2, 1969

3,465,213

SELF-COMPENSATING STRUCTURE FOR LIMITING BASE DRIVE CURRENT IN TRANSISTORS

Frances B. Hugle, Santa Clara, Calif., assignor to William B. Hugle, Executor of said Frances B. Hugle, deceased Filed June 20, 1966, Ser. No. 558,979

Int. Cl. H01l 11/14, 15/00

U.S. Cl. 317—235 1 Claim

ABSTRACT OF THE DISCLOSURE

A semiconductor structure having a transistor and a resistor of semiconductor material connected to the base of the transistor. The width (thickness, depth) of the base of the transistor and the width of the resistor are the same, by virtue of being formed simultaneously in close proximity on a semiconductor chip. This provides a self-compensating circuit structure for limiting base drive current in the transistor to a preferred value by; (1) matching the resistance value of the resistor to the current gain (beta) of the particular transistor involved because of the simultaneous formation of each upon the same semiconductor chip, and (2) neutralizing variations of temperature in the operation of the transistor because of the close proximity of the transistor and the resistor and the equivalent thermal properties of each having opposite effects.

This invention relates to microcircuits wherein a number of electronic components are constructed by repeated diffusion processes on a chip of substrate material. More particularly it is a process or method of manufacturing such a circuit in such a way that optimum base drive current is supplied to the transistors therein regardless of wide variations in the transistor current gain (hereinafter referred to as beta ($\beta$) which may result in microcircuit manufacture by diffusion processes.

In the field of semiconductor integrated circuits it is the general practice to employ a series of diffusion processes in circuit construction. Many integrated microcircuits are constructed at one time wherein several electronic components are simultaneously formed on one chip of substrate material. These components almost invariably include one or more transistors. The transistor betas are highly sensitive to diffusion variations and are extremely difficult to control. Furthermore beta varies widely with the operating temperature of a given circuit. In scuh circuits it is important that the electronic components used in conjunction with the transistors have characteristics to match the uncontrollable variations in beta. One such component which is particularly important in this respect is the transistor base drive resistor which supplies the signal current to the transistor base.

Integrated circuits are designed to operate over a fairly wide range of transistor parameters, since selection of individual components is obviously impossible. In many circuits the current to the base of a transistor is supplied through a resistor whose value is chosen low enough to supply adequate current to turn on the transistor in the worst case situation. This being the lowest B.

Since B varies considerably from run to run, from wafer to wafer within a run, and even within a wafer, integrated circuits are designed to tolerate wide variations in B, a range from 15 to 100 being fairly typical. Furthermore, B varies with temperature, going down as the temperature drops. A variation in B of 15 to 100 at room temperature could expand to 10 to 150 if the circuit operates from −55 C. to +125 C. On the other hand, resistor values are quite reproducible, seldom varying more than ±10% in diffused silicon devices.

When the resistor value is selected to supply adequate current to a B of 10 transistor, there is 15 times too much current into the base of the B of 150 transistor. This "overdrive" causes excessive storage when the transistor is in saturation and results in long turn-off times. In high speed switching circuits this "overdrive" can severely limit the operating speed. In non-saturated circuits, "overdrive" can cause saturation, resulting in slow and/or malfunction.

The primary advantage over "prior art," which this invention teaches is the construction of a microcircuit base drive resistor in such a way that the value of the resistor varies with the transistors beta and in such a manner as to compensate for beta variations. When beta is low, the base a drive resistor is also low and when beta is high, the resistor is high. Since base drive current passes thru the base drive resistors this results in self compensation; i.e. a low resistor passes more current to the base of a low B transistor where it is needed for complete saturation. This results in optimum transistor performance from viewpoints of dissipation, speed of turn off and minimum distortion or clipping. The transistor, regardless of its B is supplied of its B is supplied with approximately the right amount of base current for saturation. This self compensating feature between transistor B and base drive resistor value is brought about by a unique method of simultaneous diffusion of the base layer of the transistor. It is this process which is the heart of this invention as hereinafter explained and illustrated.

Another advantage is that the "base layer" type resistor employed in this invention has a temperature coefficient which varies in such a way as to compensate for transistor B variation caused by temperature. Thus affording built-in temperature compensation.

Still another advantage is the fact that the base layer resistor has a much higher ohmic value per square and therefore smaller size than a conventional single diffusion resistor.

An object of the present invention is the provision of a process for manufacturing integrated microelectronic circuits in such a way that transistor base current over drive is automatically reduced by the manufacturing process.

Another object is to provide a method of transistor integrated circuit manufacture which is cheap and simple, yet results in optimum transistor operating speed and performance.

Other objects and many of the attendant advantages of this invention will be readily appreciated as the same becomes better understood by reference to the following detailed description when considered in connection with the accompanying drawings, wherein.

Figure 1:
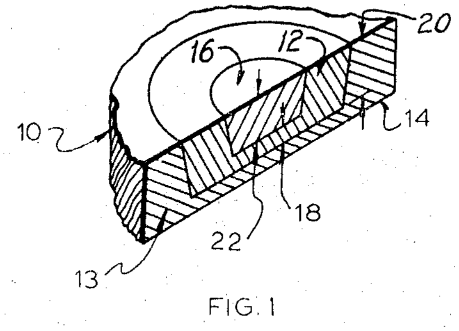
FIGURE 1 shows an isometric partly in section of a typical double diffusion transistor.

Referring now to the drawings wherein like reference numerals designate like or corresponding parts throughout the several views there is shown in FIGURE 1, a typical double diffusion transistor 10 in isometric cross-section.

This transistor 10 is made by the well known to the "art" process of selective base 12 diffusion into a collector semiconductor material 14 which may be but is not necessarily an epitaxial layer. If an epitaxial layer, it may have undergone one or more previous masking, oxidation or diffusion steps. After the selective base 12 diffusion, the surface masking layer, usually an oxide is selectively etched for the emitter 16 diffusion. This is done within the already formed base 12 diffusion. The process is well known and no purpose would be served by a repetition.

The narrow region under the emitter 16 is the base thickness hereafter termed width 18 of the base 12 and is the difference between the total base 12 diffusion depth 20 and the depth 22 of the subsequent emitter 16 diffusion therein. Small differences in base diffusion depth 20 or emitter diffusion depths 22 make relatively large percentage differences in the base width 18 and this in turn causes very large variations in transistor B. Other conditions being equal a narrow base width 18 results in a higher transistor B than a wider base 18.

The time that a given diffusion is permitted to take place and to an equal extent many other uncontrollable environmental conditions determine the depth to which the diffusion penetrates. Though variations in diffusion parameters tends to be large and difficult to control from wafer to wafer within a run, and even from one part of a wafer to another, across short distances conditions are relatively uniform and within a single integrated circuit, diffusions and transistor parameters are closely matched, the shorter the distances, the better the match. Since the base layer width 18 as explained determines the transistor B all transistors in close proximity on the same chip 14 will have approximately the same B.

Figure 2:
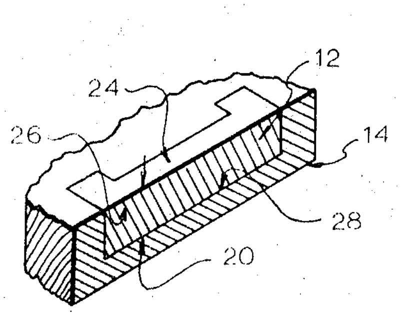
FIGURE 2 shows an isometric of the present customary standard configuration of the technique for making resistors by employing single diffused strips on the chip substrate.

In FIGURE 2 is shown a conventional single diffusion resistor 14 in isometric cross-section. This resistor 24 is formed by the base diffusion 12 only and its ohmic value is only slightly effected by variations in the diffusion depth 20. This is due to the fact that the relatively high impurity concentration at the surface 26 is the principal conducting region. The deep part 28 at the bottom of the diffusion depth of the resistor 24 carries little current. The ohmic value of such a resistor 24 is quite low for normal microelectronic circuit component dimensions. It is typically 100 to 200 ohms per square.

Figure 3:
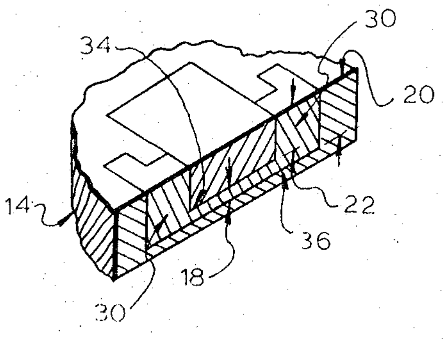
FIGURE 3 shows an isometric of a resistor formed by the narrow region of the "base" diffusion remaining under the "emitter" diffusion. This layer having the same thickness and resistivity as the "base" of any adjacent transistor.

In FIGURE 3 is shown a base layer resistor 30 of the type suitable as a base drive resistor for the transistor 10 shown in FIGURE 1. This type of resistor 30 has a sheet resistivity of about 5 to 50 kilohms per square. The base width 18 of this resistor 30 is formed by the same two diffusion processes which created diffusion depths 20, 22 as were used to form the base width 18 of the transistor 10 in FIGURE 1. Therefore this resistor 30 has approximately the same width 18 as the transistor 10 base width 18. The resistor base layer width 18 here effects the ohmic resistance much more than the diffusion depth 20 does in the single diffusion resistor 24 shown in FIGURE 2. The dependence of resistance on width 18 in this case is more than linear because the doping of the base layer 30 is graded; the top 34 having lower resistivity than the bottom 36. When the resistor base layer width 18 is the same as the transistor 10 base width 18, as occurs automatically within the short distances between components on a single integrated circuit, the narrow base width 18 or high B transistors 10 have as their base drive resistors correspondingly higher ohmic value base layer resistors 30 supplying their base current, thus preventing excessive overdrive. This is due to the fact that being formed by the same processes the resistor base layer width 18 is approximately the same as the transistor 10 base width 18. In other areas of the semiconductor 14 where the base width 18 of a transistor is greater and therefore has a correspondingly lower B the ohmic value of the base layer resistor 30 which supplies the transistor 10 base drive current is also lower because of its greater width 18 which in turn allows more base drive current to flow from the voltage supply thus compensating for the lower transistor 10B.

Figure 4:
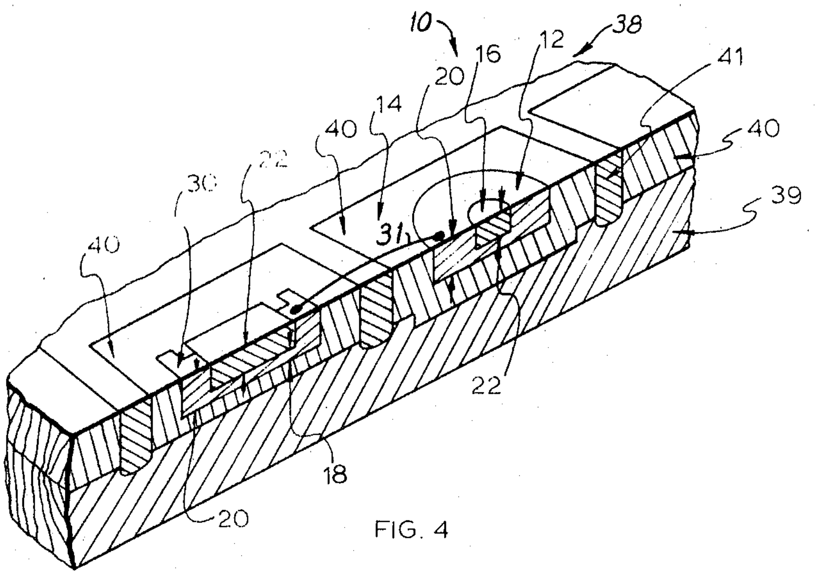
FIGURE 4 shows an isometric of a typical microelectronic circuit section showing a base layer resistor and transistor diffused into an epitaxial layer on a substrate.

In FIGURE 4 is shown an isometric of a section of an integrated circuit 38 showing original substrate material 39. Superimposed on the substrate material 39 is an epitaxial layer 40. Into this epitaxial layer 40 the base layer 12 to a depth 20 of a transistor 10 is diffused. Next within the area of the base diffusion 12 yet not to as great a depth 22 an emitter 16 is diffused. The epitaxial layer 40 in its original undiffused condition surrounds the base 12 which in turn contains the emitter 16. The original epitaxial layer 40 makes up the transistor 10 collector 14. On the same epitaxial layer 40 and closely adjacent thereto, shown to the left, is the base drive resistor 30 of this invention. The depth 20 of this resistor 30 corresponds to and is approximately the same as the base layer depth 20 of the adjacent transistor 10 and is made by the same diffusion processes which formed the said transistor 10 base diffusion depth 20. Likewise the diffusion depth 22 forming the upper boundary of resistor 30 is caused by the same diffusion which formed the emitter 16 of transistor 10. The transistor 10 is shown to the right. The resistor 30 width 18 if therefore the same as the transistor 10 base width 18. In normal practice, in addition to the diffusion formation of the transistor 10 and base layer resistor 30 the epitaxial layer 40 is subjected to a very deep selective diffusion 41 which goes completely through the epitaxial layer 40 and joins the original substrate material 39. In the illustration the substrate material 39 is of the P type although it could just as well have been N, in which case the various diffusion processes' polarities would be the opposite. This deep diffusion 41 is also P like the original substrate material 39. It therefore electrically isolates the transistor 10 from its adjacent base drive resistor 30. It is understood, of course, that in further processing of the integrated circuit 38 a metal or other type low resistance connection path 31 is made between the components, including the transistor 10 and resistor 30 of the integrated circuit 38 in accordance with the electronic function to be performed. It is also to be understood, of course, that a multitude of other components (not shown) may or may not be formed either simultaneously along with the base layer resistor 30 and the transistor 10 or before or after. The base layer resistor 30 and transistor 10 are shown side by side in relatively close proximity as they would normally have to be so as to attain maximum ohmic base layer resistance 30 compensation for transistor 10B variations as already described in detail. This is another way of saying in effect that the width 18 of transistor 10 and the width 18 of resistor 30 are the same within any given small area of the integrated circuit 38.

Figure 5:
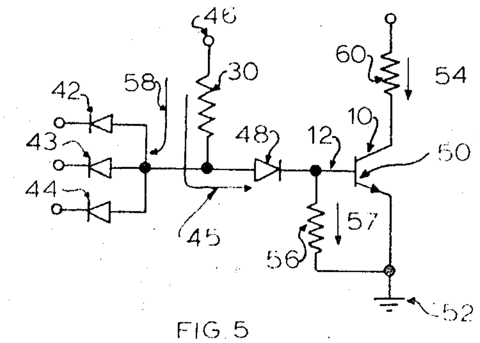
FIGURE 5 shows a circuit diagram of a typical DTL NAND GATE used as an example of a circuit that would be improved by making the base drive resistor in accordance with the process of this invention.

In FIGURE 5 is shown a typical NAND GATE semiconductor circuit schematic. Here the common emitter connected NPN transistor 10 is turned on if all three diodes 42, 43 and 44 are back biased at the same time. If this were the case conventional base current indicated by arrow 45 would flow from the positive voltage supply 46 through the base drive resistor 30, diode 48 and transistor 10 base emitter junction 50 to ground 52. The collector current indicated by arrow 54 has a maximum upper value for a given circuit dependent upon its application. It is shown flowing through the collector load resistor 60. It is desirable that the base drive current 45 does not greatly exceed that necessary to support the maximum collector current 54 which is to be anticipated in the particular circuit application. Ideally, the base drive current 45 should be equal to and no greater than the collector current 54 divided by the transistor 10B. The resistor 56 (shown for illustrative purposes only) between the transistor 10 base 12 and ground 52 is of a much higher value than the base drive resistor 30 and hence effectively out of the circuit when the transistor 10 is driven on. However, when the transistor 10 is turned off by a diversion of the base drive current 45 away from the transistor 10 base 12 and through any forward biased combination of the diodes 42, 43 and 44 as is indicated by arrow 58 the storage charge of the transistor 10 base dumps through this resistor to ground 52 as is indicated by arrow 57.

Obviously many modifications and variations of the present invention are possible in the light of the above teachings. It is therefore to be understood that within the scope of the appended claims the invention may be practiced otherwise than specifically described. This process is obviously not limited to any particular substrate material employed; is applicable to all semiconductor devices NPN, PNP and any other device which has a control junction current gain characteristic dependent on a diffusion layer thickness. The process disclosed is not in any way limited to integrated circuits but may be employed anywhere that base drive resistors and transistor are geometrically closely located together and undergo the same diffusion processes in their manufacture.

Having thus described the invention, what is claimed is:

1. A semiconductor structure comprising:

(a) a transistor (10), having an emitter (16), a base (12) and a collector (14),
  at successively lower strata in semiconductor material and of successive alternate conductivity type of semiconductor material;

(b) a companion resistive region (30, 18) formed in said semiconductor material during the same diffusion in which said base is formed, positioned slightly horizontally removed from said base (12), having the same conductivity type and the same width (18) vertically as that of said base (12),
  and a lateral extent greater than the lateral extent of said emitter (16) by a factor in excess of two;

(c) an emitter type diffusion (22) of opposite conductivity type to that of said base (12),
  overlaying only the central portion of the semiconductor material of the base strata of said resistive region (30, 18), and (d) an electric conductor (31) connecting said resistive region (30, 18) and said base (12),
  to form a compensated base drive circuit,
  whereby the resistance of said resistive region (30, 18) is matched to the current gain (beta) of said transistor,
  is greater by a factor in excess of three than the resistance of said base (12),
  and varies in resistance with temperature to compensate for variation of said current gain with temperature.

References Cited

UNITED STATES PATENTS

| | | | |
|---|---|---|---|
| 3,387,193 | 6/1968 | Donald | 317—235 |
| 3,404,321 | 10/1968 | Kurosawa et al. | 317—235 |
| 3,220,896 | 11/1965 | Miller | 148—33.5 |
| 3,260,902 | 7/1966 | Porter | 317—235 |
| 3,275,910 | 9/1966 | Phillips | 317—235 |
| 3,305,913 | 2/1967 | Loro | 29—25.3 |

JAMES D. KALLAM, Primary Examiner

J. R. SHEWMAKER, Assistant Examiner